United States Patent [19]
Li et al.

[11] Patent Number: 5,854,114
[45] Date of Patent: Dec. 29, 1998

[54] DATA RETENTION OF EEPROM CELL WITH SHALLOW TRENCH ISOLATION USING THICKER LINER OXIDE

[75] Inventors: Xiao-Yu Li, San Jose; Radu Barsan, Saratoga; Sunil D. Mehta, San Jose, all of Calif.

[73] Assignee: Advanced Micro Devices, Inc., Sunnyvale, Calif.

[21] Appl. No.: 947,888

[22] Filed: Oct. 9, 1997

[51] Int. Cl.$^6$ ................................................. H01L 21/336
[52] U.S. Cl. ........................... 438/296; 438/248; 438/424; 438/435; 438/257
[58] Field of Search .................... 438/296, 248, 438/424, 435, 259, 262, 257

[56] References Cited

U.S. PATENT DOCUMENTS

| | | | |
|---|---|---|---|
| 4,870,470 | 9/1989 | Bass, Jr. et al. | 257/324 |
| 5,008,722 | 4/1991 | Esquivel | 257/316 |
| 5,040,036 | 8/1991 | Hazani | 257/324 |
| 5,042,008 | 8/1991 | Iwasa et al. | 257/319 |
| 5,229,312 | 7/1993 | Mukherjee et al. | 438/259 |

*Primary Examiner*—Trung Dang
*Attorney, Agent, or Firm*—Davis Chin

[57] ABSTRACT

A shallow trench isolation structure and a method for forming the same for use with non-volatile memory devices is provided so as to maintain sufficient data retention thereof. An epitaxial layer is formed on a top surface of a semiconductor substrate. A barrier oxide layer is formed on a top surface of the epitaxial layer. A nitride layer is deposited on a top surface of the barrier oxide layer. Trenches are formed through the epitaxial layer and the barrier oxide layer to a depth greater than 4000 Å below the surface of the epitaxial layer so as to create isolation regions in order to electrically isolate active regions in the epitaxial layer. A liner oxide is formed on sidewalls and bottom of the trenches to a thickness between 750 Å to 1500 Å. As a result, leakage current in the sidewalls are prevented due to less thinning of the liner oxide layer by subsequent fabrication process steps.

14 Claims, 6 Drawing Sheets

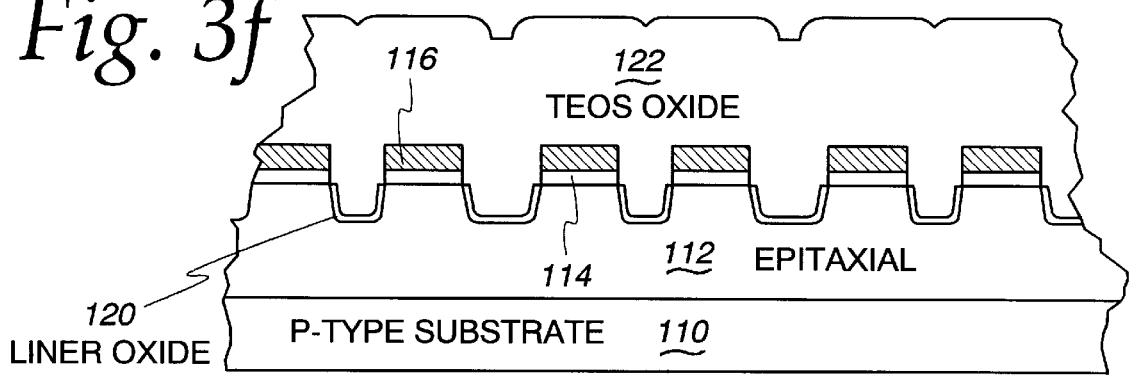
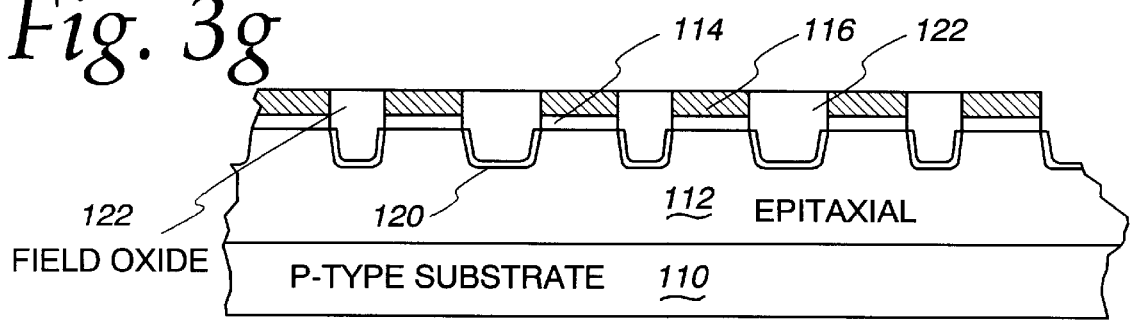
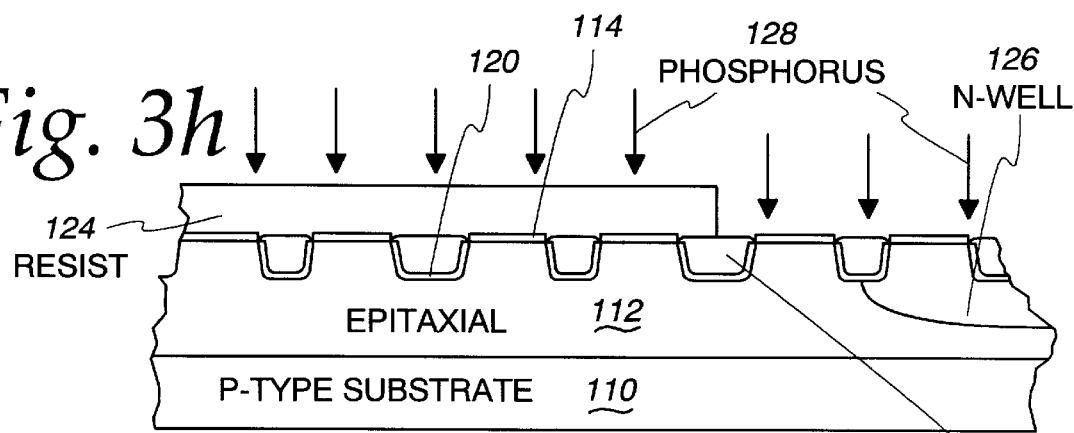
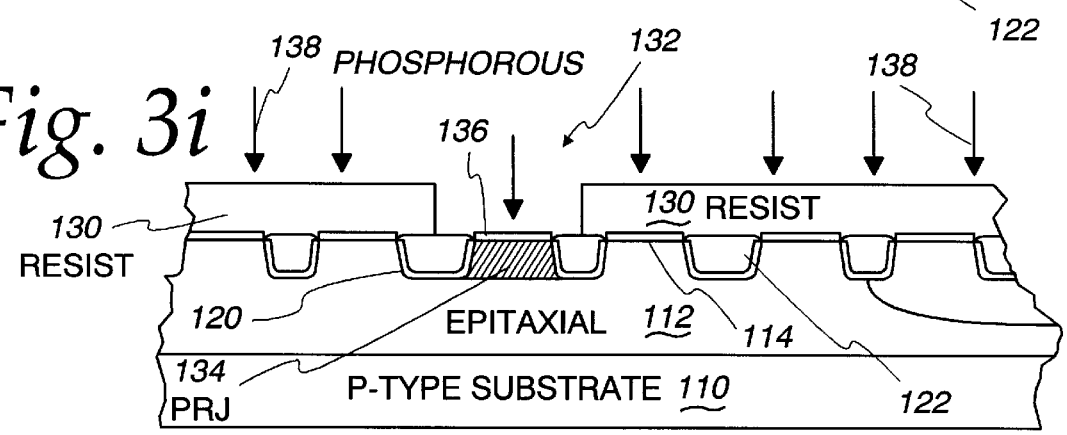

DATA RETENTION OF EEPROM CELL WITH SHALLOW TRENCH ISOLATION USING THICKER LINER OXIDE

BACKGROUND OF THE INVENTION

1. Field of the Invention

This invention relates generally to non-volatile memory devices such as erasable and electrically programmable read-only memory (EPROM) cells; electrically, erasable programmable read-only memory (EEPROM) cells; and Flash EEPROM cells useful in memory arrays and programmable logic devices. More particularly, it relates to a shallow trench isolation structure and a method for fabricating isolation regions between active regions of an EEPROM cell in a semiconductor substrate so as to maintain sufficient data retention.

2. Description of the Prior Art

In recent years, there has been a trend of making semiconductor integrated circuits which contain higher and higher numbers of active devices packed more densely on the same silicon substrate area to provide increased complex functions and high performance. The density is dependent upon the area required to separate or isolate the active devices on the same semiconductor substrate from each other. In view of this, there has arisen a high interest by I.C. designers of developing various techniques to isolate such devices on the integrated circuits so as to achieve higher densities.

One of the most important isolation techniques developed, which has been used very extensively heretofore, is referred to as LOCOS (isolation for local oxidation of silicon). This LOCOS technique involves the formation of oxide in the non-active or field areas of the semiconductor substrate between active regions so as to prevent the electrical interaction of adjacent active devices. However, as the active device geometries were reduced to sub-micron dimensions, the effectiveness of the LOCOS isolation technique was significantly degraded because of large encroachments into the active devices which prevents scalability. As a consequence, alternative isolation processes were needed to overcome this drawback of the LOCOS technique.

Therefore, a newer isolation approach was developed referred to as trench/refill isolation in which trenches are etched between adjacent active regions of the semiconductor substrate. Basically, the trench/refill technique is divided into three categories as follows: (1) shallow trenches having a depth of less than 1 $\mu$m, (2) moderate, deep trenches having a depth of between 1 to 3 $\mu$m, and (3) deep, narrow trenches having a depth greater than 3 $\mu$m and a width of less than 2 $\mu$m.

There has been reported in an article entitled "Corner-Rounded Shallow Trench Isolation Technology to Reduce the Stress-Induced Tunnel Oxide Leakage Current for Highly Reliable Flash Memories" and authored by H.Watanabe et al., IEDM 96, pp. 833–836, that using corner-rounded shallow trench isolation for flash memories could reduce the stress-induced leakage current of the tunnel oxide so as to improve data retention.

Nevertheless, there still exists a need for a shallow trench isolation structure and a method for fabricating isolation regions between active regions of a EEPROM cell in a semiconductor substrate so as to maintain sufficient data retention.

SUMMARY OF THE INVENTION

Accordingly, it is a general object of the present invention to provide a method of fabricating a shallow trench isolation region in a non-volatile memory device which reduces its cell size.

It is an object of the present invention to provide a shallow trench isolation structure and a method for fabricating isolation regions between active regions of a EEPROM cell in a semiconductor substrate.

It is another object of the present invention to provide a shallow trench isolation structure and method for use with non-volatile memory devices so as to maintain sufficient data retention.

It is still another object of the present invention to provide a method for fabricating shallow trench isolation structures for use with non-volatile memory devices which includes a liner oxide layer having a thickness between 750 Å to 1500 Å.

It is still yet another object of the present invention to provide a shallow trench isolation structure formed in a semiconductor substrate between active regions which prevents leakage caused by subsequent fabrication process steps.

In accordance with a preferred embodiment of the present invention, there is provided a method for fabricating shallow trench isolation structures for use with non-volatile memory devices to maintain sufficient data retention thereof. An epitaxial layer is formed on a top surface of a semiconductor substrate. A barrier oxide layer is formed on a top surface of the epitaxial layer. A nitride layer is deposited on a top surface of the barrier oxide layer. Trenches are formed through the epitaxial layer and the barrier oxide layer to a depth greater than 4,000 Å below the top surface of the epitaxial layer so as to create isolation regions to electrically isolate active regions in the epitaxial layer from each other. A liner oxide layer is formed on the sidewalls and bottom of the trenches to a thickness between 750 Å to 1500 Å.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 3(a) through 3(m) are cross-sectional views of the fabrication steps for performing the shallow trench isolation having a thicker liner oxide, according to the principles of the present invention;

DESCRIPTION OF THE PREFERRED EMBODIMENT

The shallow trench isolation method of the present invention will be described as incorporated into a non-volatile memory device such as an electrically, erasable programmable read-only memory (EEPROM) cell structure of FIG. 2. However, it should be clearly understood that the shallow trench isolation method according to the present invention is equally applicable to an EPROM cell or a Flash EEPROM cell so as to create isolation structures in order to isolate certain active regions from each other. By utilizing this shallow trench isolation method of the present invention, the EEPROM cell structure of FIG. 2 will have an increased performance due to the reduced parasitic capacitance. Further, the EEPROM cell structure will occupy less surface area so as to thus allow a higher packing density on a semiconductor substrate.

Figure 1:
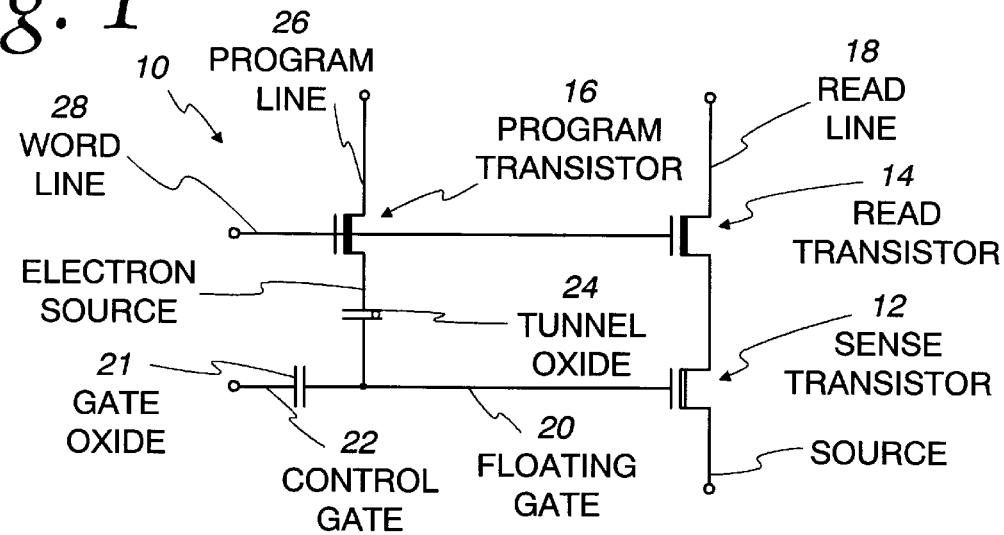
FIG. 1 is a schematic circuit diagram of an EEPROM cell.

With reference initially to FIG. 1, there is shown a schematic circuit diagram of a EEPROM cell 10 which is comprised of a floating gate sense transistor 12, a read transistor 14, and a program or write transistor 16. The read transistor 14 has its drain connected to a Read line 18 and its source connected to the drain of the sense transistor 12. The sense transistor has its floating gate 20 capacitively coupled via a gate oxide 21 to a Control Gate line 22 and also capacitively coupled via a tunnel oxide 24 to the source of the program transistor 16. The program transistor 16 has its drain connected to a Program line 26 and its gate connected to the gate of the read transistor 14 and to a Word line 28.

Figure 2:
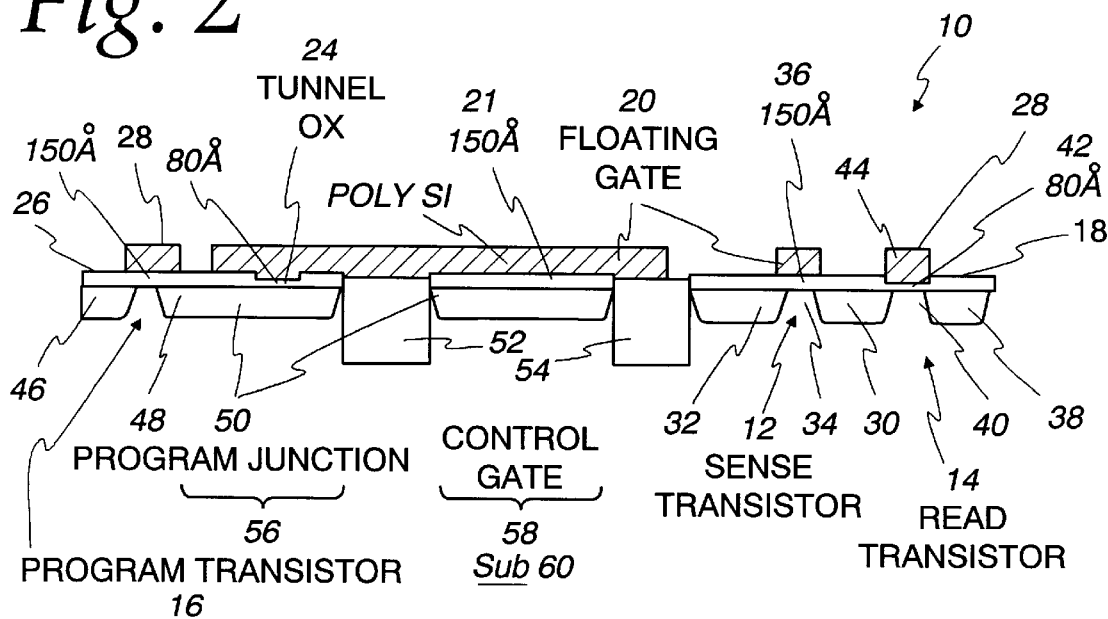
FIG. 2 is a cross-sectional view of the EEPROM cell of FIG. 1 in which the shallow trench isolation method of the present invention is applied.

In FIG. 2, there is illustrated a cross-sectional view of the construction of the EEPROM cell structure 10 of FIG. 1. As fabricated, the floating gate sense transistor 12 is formed with N+ drain region 30 and N+ source region 32, and a channel region 34 formed between the drain and source regions. A gate oxide layer (approximately 150 Å in thickness) is formed above the channel and an N-type polycrystalline silicon (poly-Si) floating gate 20 is formed over the gate oxide 36. The read transistor 14 is formed with N+ drain region 38 and the N+ source region 30 with a channel region 40 disposed therebetween. A gate oxide layer 42 (approximately 80 Å in thickness) and a gate structure 44 are formed over the channel region 40. The program transistor 16 is formed with N+ drain region 46, N+ source region 48, and a programmable junction region 50.

The tunnel oxide layer 24 is formed between the program junction region 50 (source or the region 48 of the program transistor 16) and the poly-Si floating gate 20. The thickness of the tunnel oxide layer is approximately 80 Å. The gate oxide layer 21 is formed between the floating gate 20 and the control gate line 22. The gate oxide layer 21 is approximately 150 Å thick. Areas 52 and 54 define isolation regions in which the shallow trench isolation structures formed according to the teachings of the present invention will be located. The shallow trench isolation structures formed in the areas 52 and 54 are used to electrically isolate active regions 56 and 58 of the semiconductor substrate 60 from surrounding devices. The fabrication steps of the present invention for manufacturing the EEPROM cell structure 10 of FIG. 2 will now be described in detail with reference to FIGS. 3(a) through 3(m).

Figure 3A:
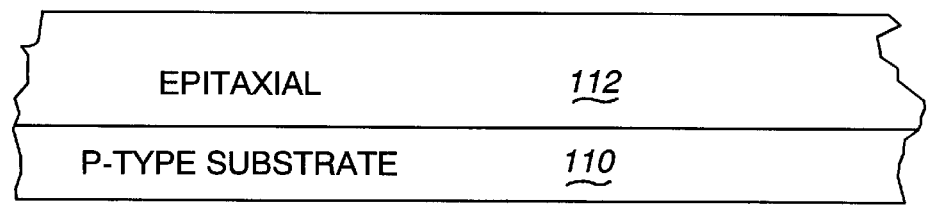
Figure 3B:
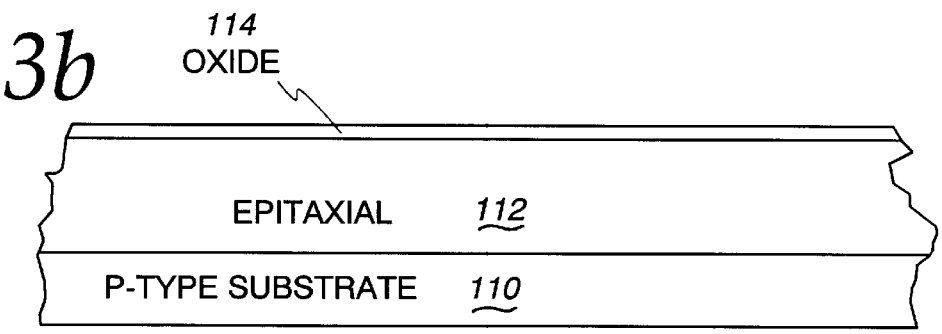
Figure 3C:
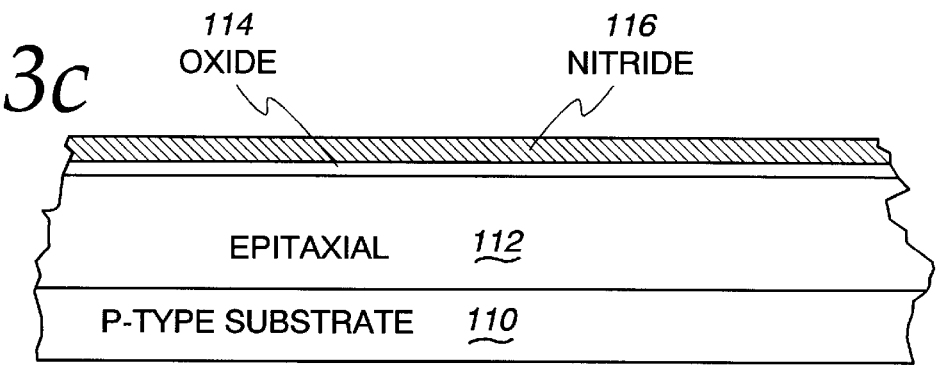

In FIG. 3(a), there is shown a p-type silicon substrate 110 on top of which is formed an n-type epitaxial (epi) layer 112. It should be understood that the teachings of the present invention are equally applicable to an N-type substrate. The epi layer 112 is typically less than 10 μm thick and is preferably about 8 μm. A thin barrier oxide layer 114 is formed on the top surface of the epi layer 112 to a thickness on the order of 150 Å, as shown in FIG. 3(b). Then, a nitride layer 116 is deposited on top of the barrier oxide 114 to a thickness on the order of 1700 Å, as shown in FIG. 3(c).

Figure 3D:
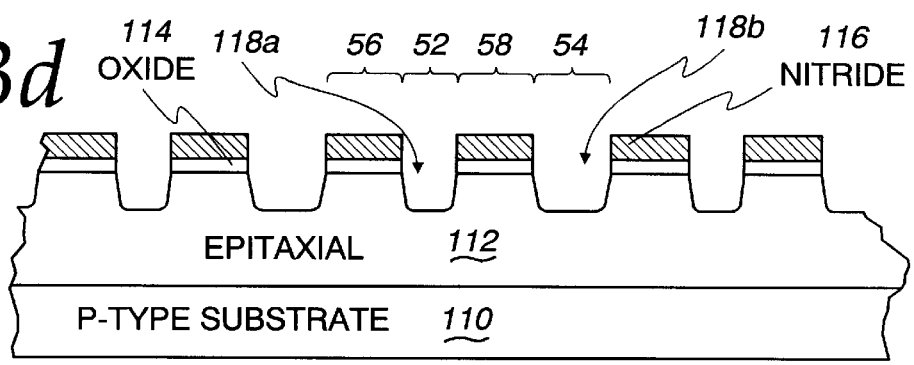

As depicted in FIG. 3(d), the outer surface of the nitride layer and the barrier oxide layer combination is patterned and etched to form trenches 118a, 118b in the respective areas 52, 54 so as to electrically isolate the active regions 56, 58 in the epi layer 112. The depth of the trenches below the surface of the epi layer 112 is on the order of greater than 4000 Å and is preferably 6000 Å. This is because of high voltage transistor operations in non-volatile memory processes which is unlike the conventional logic process that does not have high voltage transistors. Therefore, the trench etch for the conventional logic process is typically less than 4000 Å.

Next, after the trenches 118 are formed using an anisotropic etch process, a liner oxide layer 120 is grown on the sidewalls and bottom of the trenches 118, which serves to prevent carriers from adjacent active devices from traveling therebetween by using the thicker liner oxide structure of the present invention. Unlike the deep submicron technology where the liner oxide thickness is made relatively thin, between 300 to 500 Å so as to avoid encroachment into the areas of the active devices, the inventors of the present invention have purposely made the liner oxide layer 120 to have a thickness dimension which is in the range of 750–1500 Å and is preferably about 1000 Å. The effectiveness of this increased thickness will be seen during the subsequent fabrication processing steps for the EEPROM cell 10 where portions of the liner oxide layer may be removed. This is illustrated in FIG. 3(e).

Figure 3E:
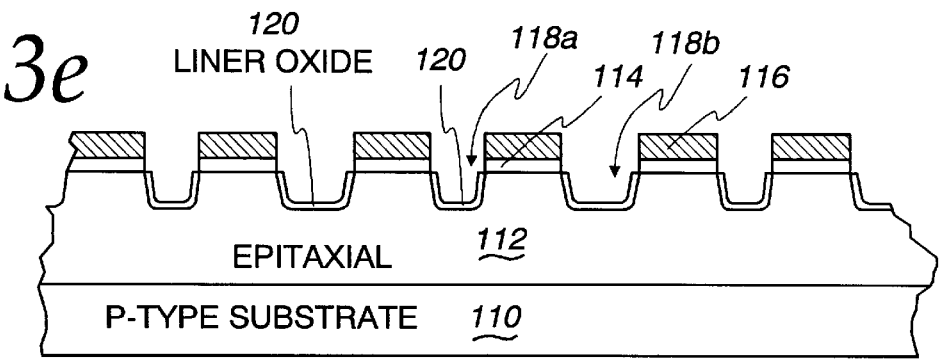

Referring now to FIG. 3(f), a TEOS (tetraeythylorthosilicate) oxide layer 122 is deposited over the topography of FIG. 3(e) to fill completely the trenches and up to a thickness of approximately 7200 Å. Then, the TEOS oxide layer is etched until the top surface of the nitride layer 116 is exposed, followed by a chemical-mechanical polishing (CMP) as is known to those skilled in the art for the removal and planarizing of TEOS oxide layer 122. The resulting structure is depicted in FIG. 3(g).

The following manufacturing steps that will now be described relate specifically to the process for producing the EEPROM cell 10 of FIGS. 1 and 2 in order to have improved data retention characteristics. Only these steps to produce the programming junction 50 in the active region 56 will be described in detail so as to assist in understanding the present invention. The remaining process techniques to be used to create subsequently the active devices in the active regions, such as channel structures, drain structures, and source structures for the transistors 12, 14 and 16 are quite conventional methods and thus will not be described.

After the polishing step, the nitride layer 116 is stripped away by etching and a photoresist layer 124 is applied to the top surface of the barrier oxide layer 114 and patterned to leave unprotected the area where an N-well implant is to be subsequently performed. The N-well implant region 126 is performed preferably with phosphorous, as indicated by arrows 128. The resulting structure is shown in FIG. 3 (h). Next, the photoresist layer 124 is removed using conventional processes. Then, another photoresist layer 130 is applied to the top surface of the barrier oxide layer 114 and is patterned, exposing an opening 132 for a subsequent programming junction (PRJ) implant 134.

As shown in FIG. 3(i), prior to the PRJ implant 134, a sacrificial oxide layer 136 is grown on the area where the PRJ implant 134 is to be performed. The sacrificial oxide layer is preferably a silicon dioxide grown by a well-known dry oxide process at a temperature of about 900° C. The thickness of the sacrificial oxide layer is approximately 200 Å, which is added to the thickness of the barrier oxide layer 114. The PRJ implant 134 (which is an n-type region serving as a source of electrons) is achieved by phosphorous ions 138 at a dose of about $1\times10^{14}$ to $1\times10^{16}$ ions/cm$^2$ and an energy of 50–100 KeV. Thereafter, the photoresist layer 130 is removed and a rapid-thermal annealing (RTA) process is performed on the PRJ implant 134 at 800°–100° C. for about 10–30 minutes.

Figure 3J:
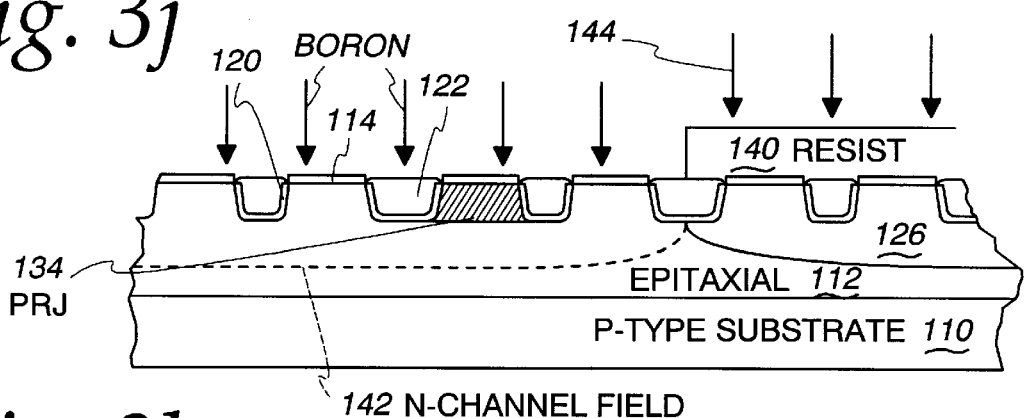
Figure 3K:
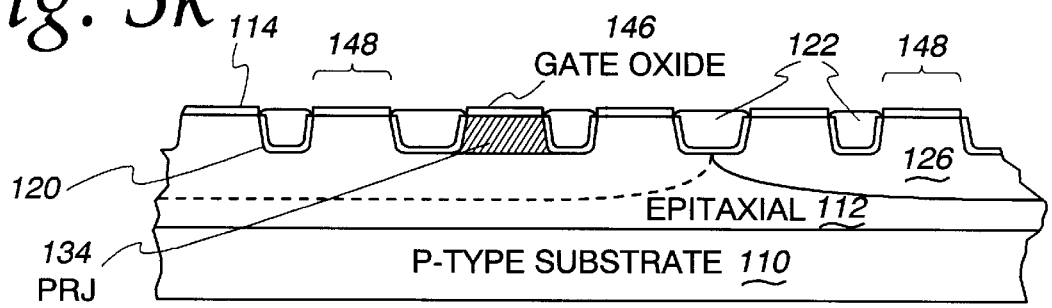

Next, a masking layer 140, such as photoresist, is lithographically patterned as shown in FIG. 3(j) to expose the area where an N-channel field implant 142 is to be subsequently performed. The N-channel field implant is performed preferably with boron 144. Then, the photoresist layer 140 is removed and a high voltage gate oxide 146 is grown in the areas 148 where high voltage transistors (sense transistor 12 and program transistor 16) are to be later formed. However, prior to the high voltage gate oxide formation, the areas 148 must be "cleaned" which requires the removal of the initial barrier oxide layer 114 and then re-growing of the high voltage gate oxide 146 to a thickness of about 150 Å by thermal oxidation in a dry oxygen atmosphere at 800°–1000° C. This result is shown in FIG. 3(k).

Figure 3L:
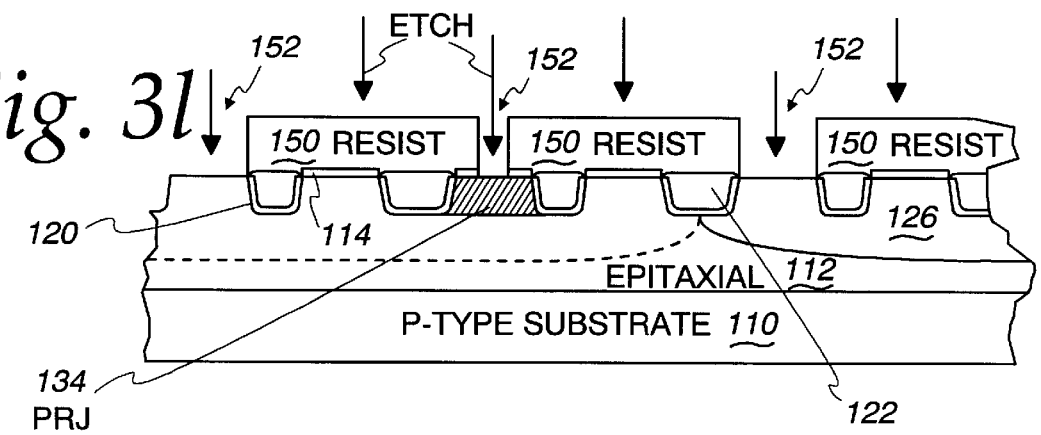

Next, the tunnel oxide 24 which is used in the programming and erasing of the floating gate 20 is established on the surface area above a portion of the PRJ implant 134. The desired location for the subsequent tunnel oxide is formed by applying a photoresist layer 150 to the surface of the substrate and patterned to define openings 152. After this, the high voltage gate oxide in the openings 152 are etched down to the top surface of the epi layer 112. This is illustrated in FIG. 3(l).

During this etching process, the rate is slower than that used in the etch rate for the TEOS layer 122 so as to provide rounded-corners of the TEOS oxide fill in the trenches 118 for avoiding leakage. However, this etching process at the same time will cause damage or removal of a portion of the liner oxide layers 120 in the trenches 118. If it were not for the increased thickness of the oxide layer 120 to approximately 1000 Å in the present invention, there would be created leakage due to the thinning of the liner oxide layer. By making the liner oxide thicker, the etching process will not degrade the isolation structures so as to cause leakage current from the sidewalls of the trenches 118. As a result of the shallow trench isolation structure of the present invention, there is prevented the degradation of the active devices formed proximate to the isolation structures so as to create an EEPROM cell having sufficient data retention.

Figure 3M:
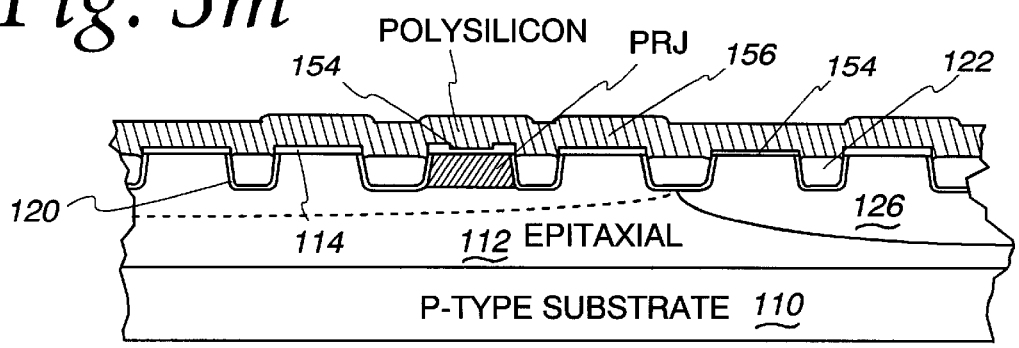

As illustrated in FIG. 3(m), thin tunnel oxides 154 are grown to a thickness of approximately 80 Å in the openings 152. These tunnel oxides are grown by thermal oxidation in a dry oxygen atmosphere at 800°–1000° C. After completion of the growth of the tunnel oxides 154, the structure is placed in a chemical vapor deposition (CVD) chamber and a polycrystalline silicon (poly-Si) layer 156 is deposited over the entire structure to a thickness of approximately 2000–3000 Å. Then, the poly-Si layer 156 is patterned and etched so as to form the floating gate 20 of the sense transistor 12 as well as the gates 28 of the read and program transistors 14, 16, as illustrated in FIG. 2.

Figure 4B:
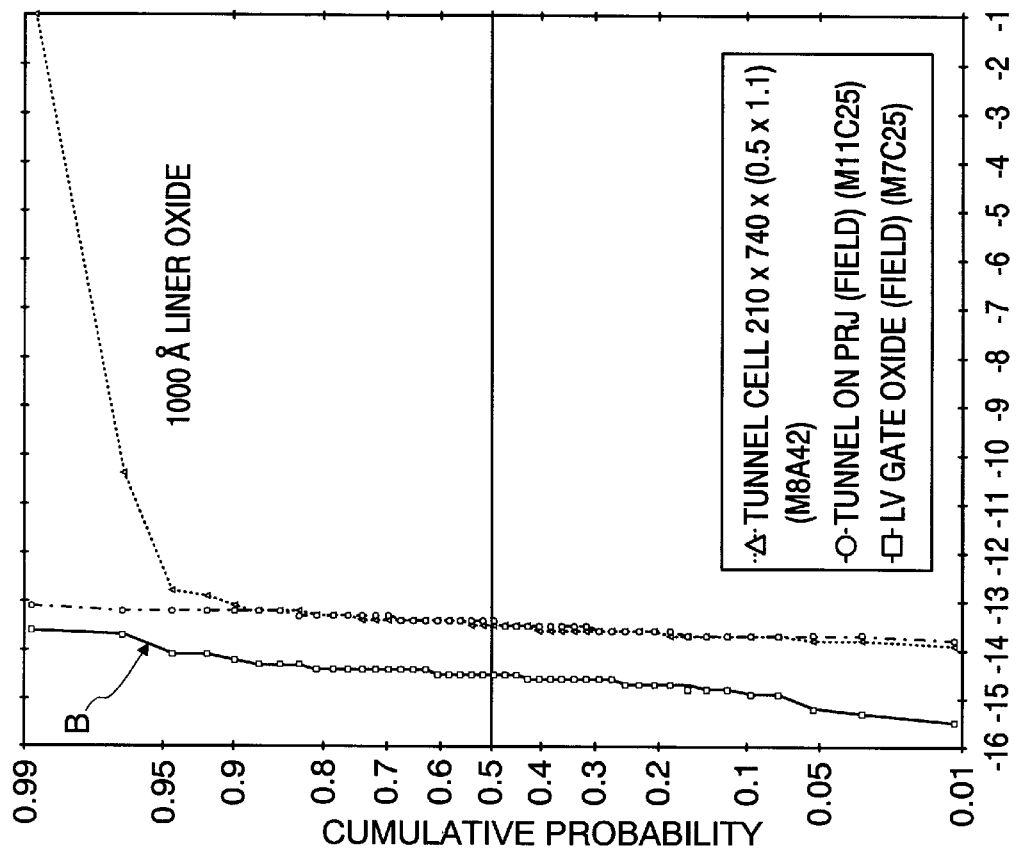
FIG. 4(b) is a cumulative probability plot, illustrating the percentage of failure as a function of applied gate voltage for a EEPROM cell with a 1,000 Å liner oxide thickness.
Figure 4A:
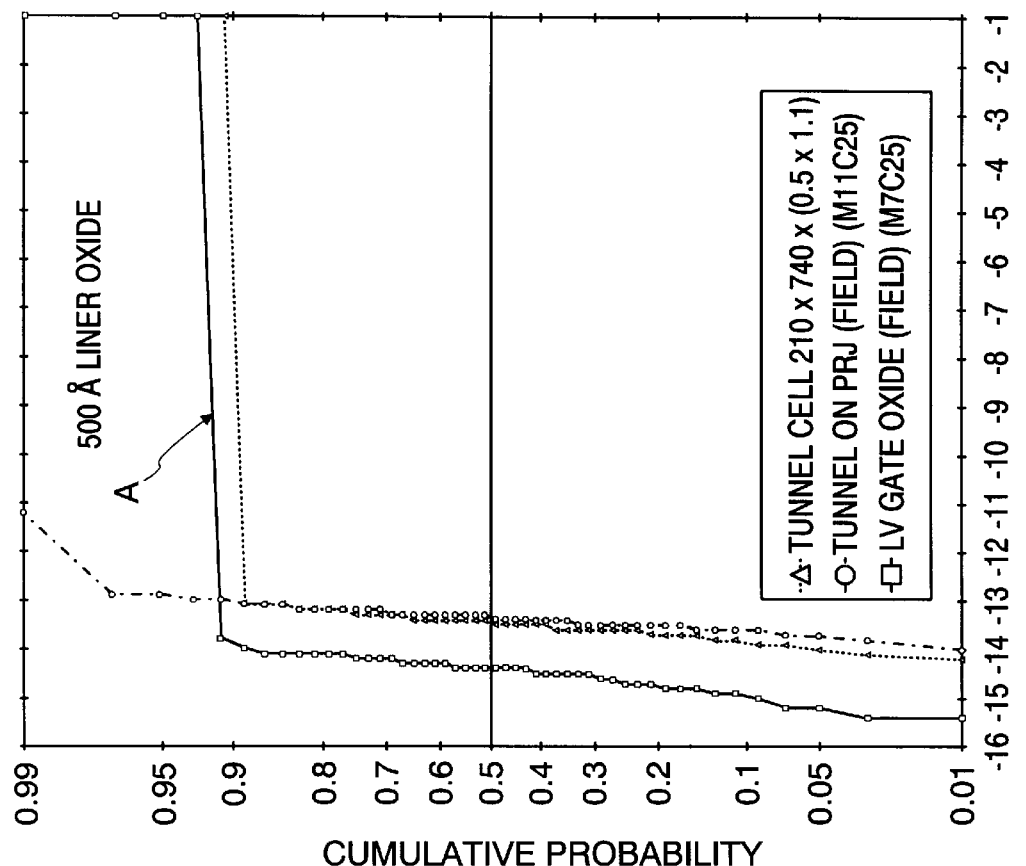
FIG. 4(a) is a cumulative probability plot, illustrating the percentage of failure as a function of applied gate voltage for a EEPROM cell with a 500 Å liner oxide thickness.

As defined herein, data retention is the length of time a particular EEPROM cell can retain information stored in the form of charges on the floating gate. When electrons transverse the tunnel oxide with no applied gate voltage to the cell, there is created a low voltage leakage current. The low voltage leakage current is dependent upon the quality of the tunnel oxide layer. In order to demonstrate the improved data retention characteristics of the EEPROM cell 10 fabricated in accordance with the manufacturing steps of the present invention, there is provided in FIG. 4(a) a cumulative probability plot illustrating the percentage of failure as a function of applied gate voltage for an EEPROM cell having a specific capacitor structure with a 500 Å liner oxide thickness. The curve A indicates that there is an approximately 10% chance of failure when the applied gate voltage is between −1 V to −14.5 V. In FIG. 4(b), there is shown in comparison a similar cumulative probability plot for the EEPROM cell with a 1000 Å liner oxide thickness. As can be seen from the curve B, there is only a 1% chance of failure when the applied voltage is −14.5 V and no substantial failure occurs between −1 V to −14.5 V.

Figure 5A:
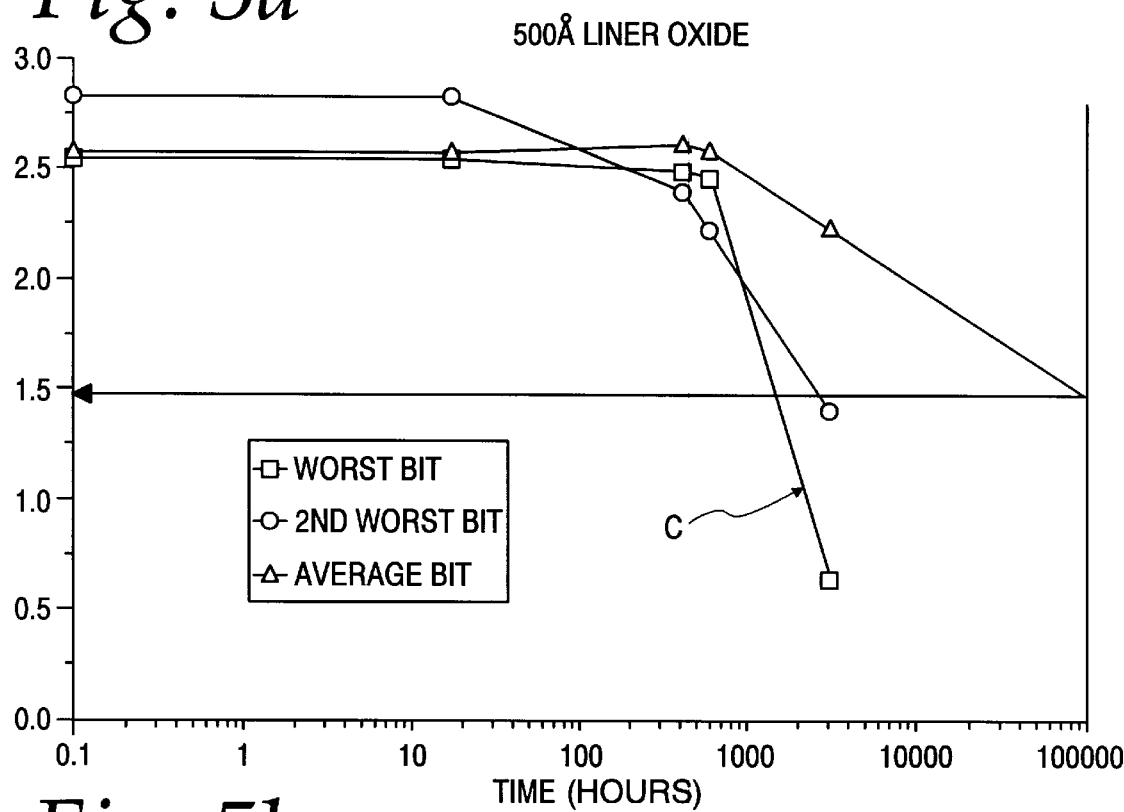
FIG. 5(a) is a graph of the threshold voltage $V_{tg}$ as a function of time for the EEPROM cell with the 500 Å liner oxide thickness.
Figure 5B:
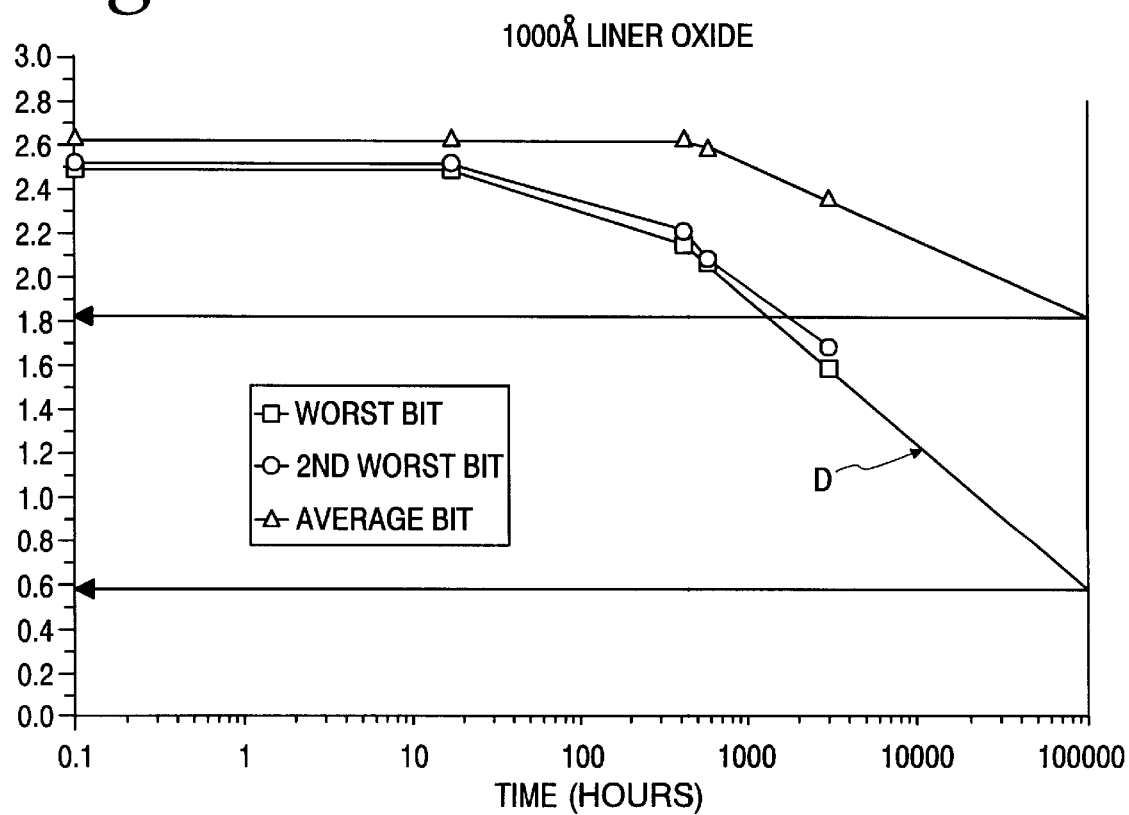
FIG. 5(b) is a graph of the threshold voltage $V_{tg}$ as a function of time for the EEPROM cell with the 1000 Å liner oxide thickness.

In order to further show the improved data retention of the present EEPROM cell 10, there is depicted in FIG. 5(a) a graph of the threshold voltage $V_{te}$ versus time for the EEPROM cell with a 500 Å liner oxide thickness. The curve C indicates that the threshold voltage begins to decrease dramatically after 1000 hours, suggesting that the cell is losing charge. Similarly, in FIG. 5(b) there is a graph of the threshold voltage $V_{te}$ versus time for the EEPROM cell with the 1000 Å liner oxide thickness. There is illustrated in curve D that the threshold voltage does not begin to decrease until after approximately 10,000 hours thereby producing sufficient data retention.

From the foregoing detailed description, it can thus be seen that the present invention provides a shallow trench isolation structure and a method for fabricating the same for use with non-volatile memory devices to maintain sufficient data retention. An epitaxial layer is formed on top surface of a semiconductor substrate. A barrier oxide layer is formed on a top surface of the epitaxial layer. A nitride layer is deposited on a top surface of the barrier oxide layer. Trenches are formed through the epitaxial layer and the barrier oxide layer to a depth greater than 4000 Å below the top surface of the epitaxial layer so as to create isolation regions in order to electrically isolate active regions in the epitaxial layer. A liner oxide layer is formed on the sidewalls and bottom of the trenches to a thickness between 750 Å to 1500 Å.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method for fabricating shallow trench isolation structures for use with non-volatile memory devices to maintain sufficient data retention thereof, comprising the steps of:

providing a semiconductor substrate;

forming an epitaxial layer on a top surface of said semiconductor substrate;

forming a barrier oxide layer on a top surface of said epitaxial layer;

depositing a nitride layer on a top surface of said barrier oxide layer;

forming trenches through said epitaxial layer and said barrier oxide layer to a depth greater than 4000 Å below the top surface of said epitaxial layer so as to create isolation regions in order to electrically isolate active regions in said epitaxial layer;

forming a liner oxide layer on sidewalls and bottom of said trenches to a thickness between 750 Å to 1500 Å;

filling completely said trenches with a TEOS oxide layer;

removing said TEOS layer down to the top surface of said nitride layer;

planarizing said TEOS oxide layer;

removing said nitride layer; and forming a non-volatile memory device having a programming junction implant in one of said active regions in said epitaxial layer.

2. A method for fabricating shallow trench isolation structures as claimed in claim 1, wherein said epitaxial layer has a thickness of about 8 μm.

3. A method for fabricating shallow trench isolation structures as claimed in claim 2, wherein said barrier oxide layer has a thickness of about 150 Å.

4. A method for fabricating shallow trench isolation structures as claimed in claim 3, wherein said nitride layer has a thickness of about 1700 Å.

5. A method for fabricating shallow trench isolation structures as claimed in claim 4, wherein the depths of said trenches are about 6000 Å.

6. A method for fabricating shallow trench isolation structures as claimed in claim 5, wherein the thickness of said liner oxide layer is about 1000 Å.

7. A method for fabricating shallow trench isolation structures as claimed in claim 6, wherein said TEOS oxide layer has a thickness of about 7200 Å.

8. A method for fabricating shallow trench isolation structures for use with non-volatile memory devices to maintain sufficient data retention thereof, comprising the steps of:

providing a semiconductor substrate;

forming an epitaxial layer on a top surface of said semiconductor substrate;

forming a barrier oxide layer on a top surface of said epitaxial layer;

depositing a nitride layer on a top surface of said barrier oxide layer;

forming trenches through said epitaxial layer and said barrier oxide layer to a depth greater than 4000 Å below the top surface of said epitaxial layer so as to create isolation regions in order to electrically isolate active regions in said epitaxial layer; and forming a liner oxide layer on sidewalls and bottom of said trenches to a thickness between 750 Å to 1500 Å.

9. A method for fabricating shallow trench isolation structures as claimed in claim 8, wherein said epitaxial layer has a thickness of about 8 μm.

10. A method for fabricating shallow trench isolation structures as claimed in claim 9, wherein said barrier oxide layer has a thickness of about 150 Å.

11. A method for fabricating shallow trench isolation structures as claimed in claim 10, wherein said nitride layer has a thickness of about 1700 Å.

12. A method for fabricating shallow trench isolation structures as claimed in claim 11, wherein the depths of said trenches are about 6000 Å.

13. A method for fabricating shallow trench isolation structures as claimed in claim 12, wherein the thickness of said liner oxide layer is about 1000 Å.

14. A method for fabricating shallow trench isolation structures as claimed in claim 13, wherein said TEOS oxide layer has a thickness of about 7200 Å.

* * * * *